(12) United States Patent
Akimoto et al.

(10) Patent No.: US 7,161,630 B2
(45) Date of Patent: Jan. 9, 2007

(54) SOLID STATE PHOTOELEMENT APPARATUS HAVING LIGHT BLOCKING CIRCUIT BOARD

(75) Inventors: Kazuo Akimoto, Narashino (JP); Motoharu Sakurai, Narashino (JP); Junichi Nio, Narashino (JP)

(73) Assignee: Seiko Precision Inc., Chiba-ken (JP)

( * ) Notice: Subject to any disclaimer, the term of this patent is extended or adjusted under 35 U.S.C. 154(b) by 611 days.

(21) Appl. No.: 10/160,145

(22) Filed: May 31, 2002

(65) Prior Publication Data

US 2002/0191103 A1    Dec. 19, 2002

(30) Foreign Application Priority Data

Jun. 5, 2001 (JP) .............................. 2001-169363
Jun. 5, 2001 (JP) .............................. 2001-169364
Apr. 30, 2002 (JP) .............................. 2002-128104

(51) Int. Cl.
H04N 3/14 (2006.01)
H04N 5/335 (2006.01)

(52) U.S. Cl. .......................... 348/394; 257/437; 257/98

(58) Field of Classification Search .................. 438/25, 438/26; 257/98, 437, 436, 294, 435, 659, 257/660; 348/294, 374, 296, 373
See application file for complete search history.

(56) References Cited

U.S. PATENT DOCUMENTS

| | | | | |
|---|---|---|---|---|
| 5,017,988 A | * | 5/1991 | Komiyama et al. | 136/244 |
| 5,097,304 A | * | 3/1992 | Itabashi et al. | 257/443 |
| 5,777,335 A | * | 7/1998 | Mochizuki et al. | 250/370.09 |
| 5,952,714 A | * | 9/1999 | Sano et al. | 257/680 |
| 6,323,891 B1 | * | 11/2001 | Kitani et al. | 347/263 |
| 6,548,815 B1 | * | 4/2003 | Umazaki | 250/370.09 |
| 6,724,503 B1 | * | 4/2004 | Sako et al. | 358/483 |
| 6,795,120 B1 | * | 9/2004 | Takagi et al. | 348/294 |
| 6,900,843 B1 | * | 5/2005 | Uchiyama | 348/374 |
| 2002/0047119 A1 | * | 4/2002 | Honda et al. | 257/59 |
| 2002/0051068 A1 | * | 5/2002 | Murayama et al. | 348/294 |
| 2002/0145676 A1 | * | 10/2002 | Kuno et al. | 348/340 |
| 2002/0190397 A1 | * | 12/2002 | Kim | 257/796 |
| 2002/0191103 A1 | * | 12/2002 | Akimoto et al. | 348/374 |
| 2004/0238943 A1 | * | 12/2004 | Fujii | 257/704 |
| 2004/0263671 A1 | * | 12/2004 | Takagi et al. | 348/340 |

\* cited by examiner

*Primary Examiner*—Vivek Srivastava
*Assistant Examiner*—Nelson D. Hernandez
(74) *Attorney, Agent, or Firm*—Jordan and Hamburg LLP

(57) ABSTRACT

To achieve light blocking performance firmly by a simple constitution with no need of separately providing a special member, a photographing element is provided on a front face side of a circuit board for a camera and a light blocking member is provided on a rear face side thereof. Connection terminal portions++ are arranged to align at a peripheral portion of the board. As the light blocking member on the rear face side, a conductive pattern or a resist having light blocking performance is used and the conductive pattern is integrally formed with one of the connection terminal portions and the resist is formed at portions excluding the connection terminal portions. The conductive pattern may be formed by copper paste and the resist may be formed by a resist of black color or the like. A recessed portion 1a for containing the photographing element is provided on die front face side or the board and the resist having light blocking performance of a resist of black color or the like is provided at an inner face of the recessed portion. An optical apparatus unit having a lens to focus an object on the photographing element is connected to the front face side of the circuit board.

9 Claims, 5 Drawing Sheets

SOLID STATE PHOTOELEMENT APPARATUS HAVING LIGHT BLOCKING CIRCUIT BOARD

BACKGROUND OF THE INVENTION

1. Field of the Invention

The present invention relates to a solid photographing apparatus mounted to portable apparatus of a portable telephone, a notebook type personal computer and the like.

2. Description of the Related Art

Conventionally, according to a solid photographing apparatus of this kind, a circuit board for a portable apparatus is made of a material for transmitting normal light of glass or epoxy species and when it is necessary that extraneous light is prevented from streaming into a photographing element as in a photographing apparatus, there is provided special means such as strictly providing light blocking means, for example, on a side of a case of a portable apparatus.

As described above, conventionally, it is necessary to separately provide some special member for blocking light and therefore, there poses a problem that the constitution becomes complicated thereby and also cost is increased.

Hence, the invention is made to be able to achieve light blocking performance by a simple constitution with no need of separately providing a special member.

SUMMARY OF THE INVENTION

According to an aspect of the invention, there is provided a solid photographing apparatus, wherein a circuit board for a camera connected with a photographing element is provided with a photographing element on one face thereof and is provided with a light blocking member on another face thereof. By the constitution, light blocking performance is achieved by a simple constitution.

According to another aspect of the invention, the light blocking member is a conductive pattern. Further, according to another aspect of the invention, the circuit board for the camera is provided with connection terminals at a peripheral portion thereof and the conductive pattern is integrally formed with one of the connection terminal portions. Further, it is preferable that the conductive pattern is formed by a copper paste.

Further, it is preferable in another embodiment that the light blocking member is a resist having a light blocking performance.

Further, according to another aspect of the invention, there is provided a solid photographing apparatus, wherein a circuit board for a camera connected with a photographing element is provided with a recessed portion for containing the photographing element and a resist having a light blocking performance is provided at an inner face of the recessed portion. By the constitution, a rear face and a peripheral face of the photographing element are covered by the resist having the light blocking performance, not only is insulating performance achieved but also light from outside other than light for photographing can be prevented from invading.

According to another aspect of the invention, the circuit board for the camera is provided with connection terminals at a peripheral portion thereof and the resist is provided at a portion of a circuit board excluding the connection terminal portions. Further, it is preferable that the resist is a resist of black color.

DETAILED DESCRIPTION OF THE PREFERRED EMBODIMENTS

An explanation will be given of embodiments of the invention based on examples applied to a portable apparatus of a portable telephone or the like in reference to the drawings.

Figure 1:
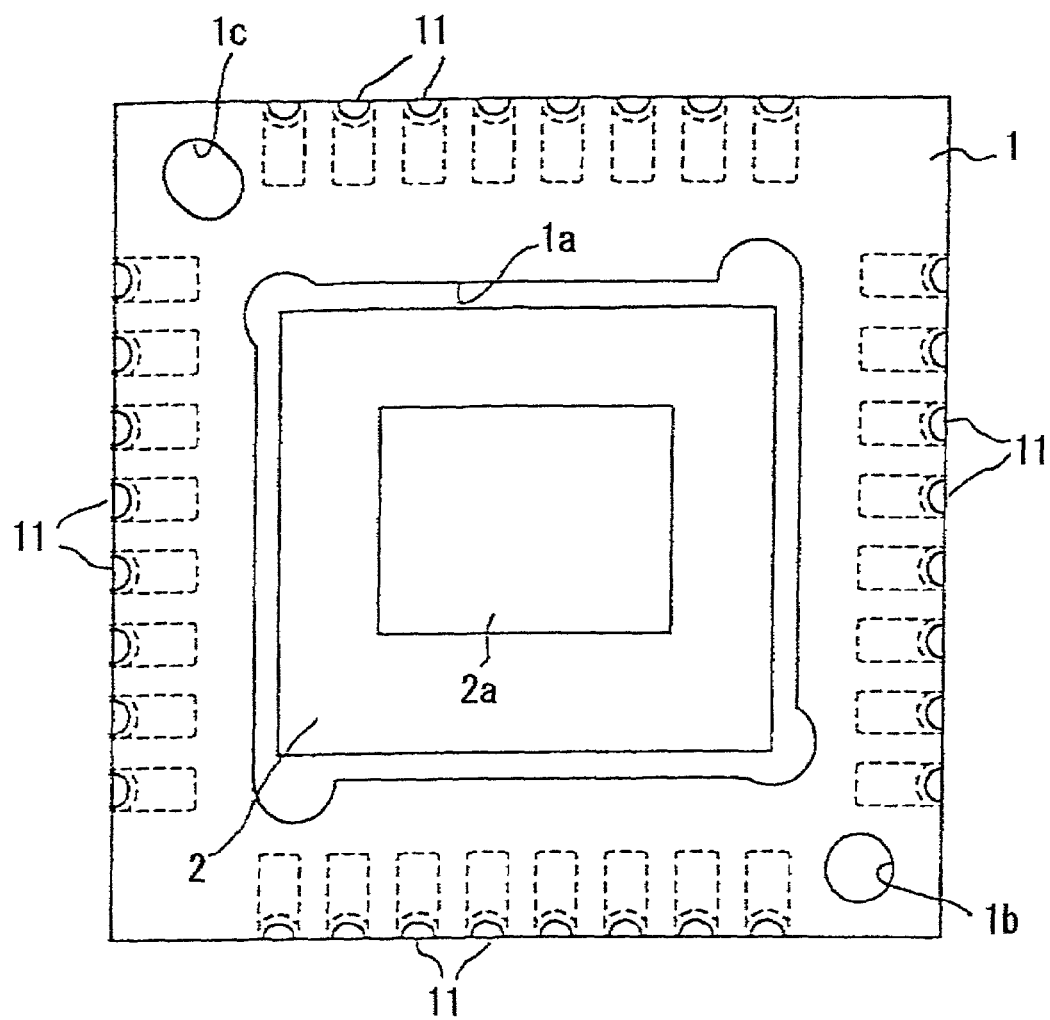
FIG. 1 shows an embodiment of the invention and is a plane view of a state of removing an optical apparatus unit.
Figure 3:
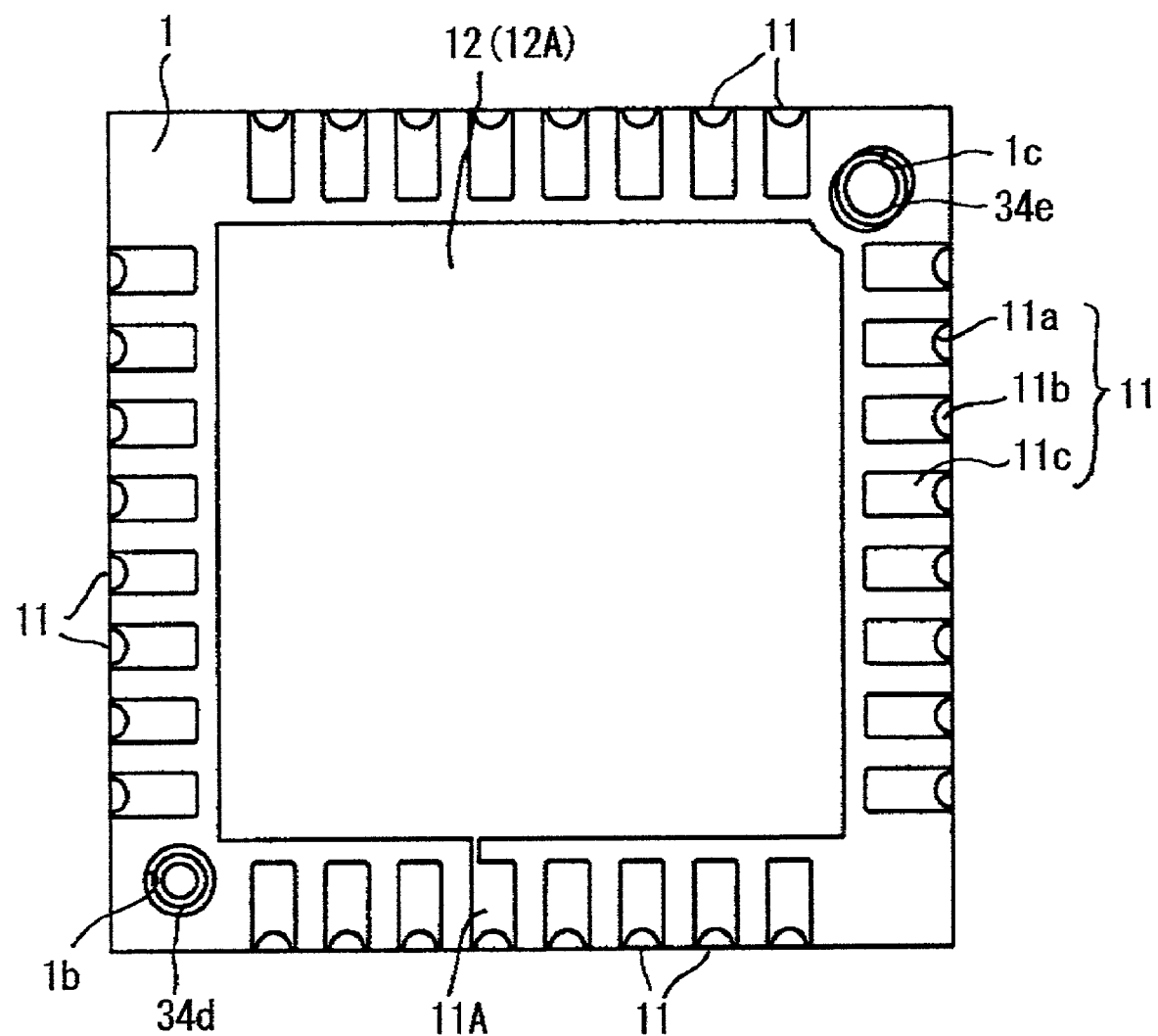
FIG. 3 is a bottom view of FIG. 1 of the embodiment.
Figure 4:
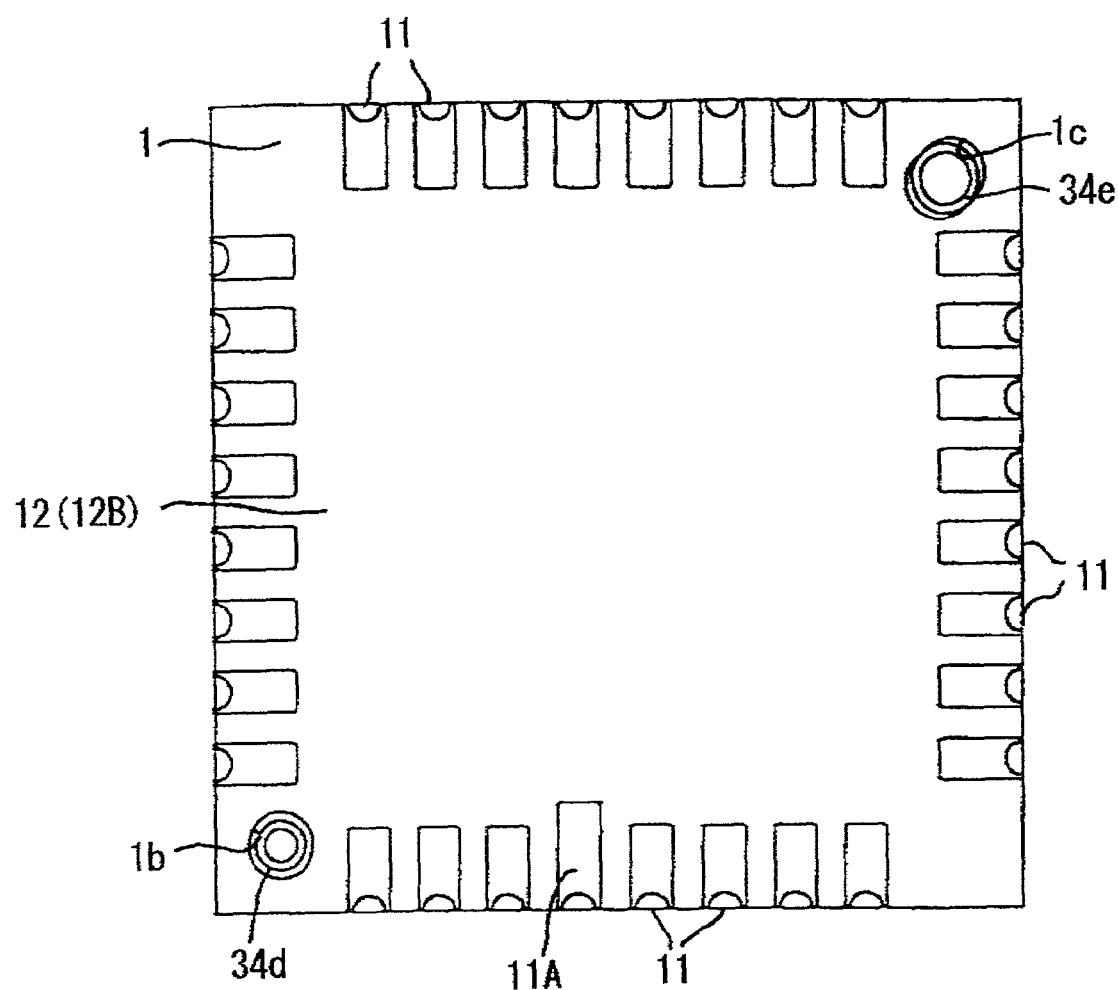
FIG. 4 is a bottom view of a circuit board for a camera showing other example of the embodiment.

As shown by FIG. 1, FIG. 3 and FIG. 4, a number of connection terminal portions 11 are formed to align at end faces of a circuit board 1 for a camera. The connection terminal portion 11 is formed with wiring patterns on a front face and a rear face thereof, an end face through hole 11a is formed at end portions of the wiring patterns, a conducting member of, for example, copper paste 11b is embedded into the end face through hole 11a and a plated layer 11c of gold or an alloy of gold and nickel or the like is formed at the wiring patterns of the front face and the rear face and faces of the copper paste 11b to thereby constitute the connection terminal portion 11. Therefore, the connection terminal portions 11 are formed to align at a flat face without constituting recessed portions at end faces of the circuit board 1 for a camera.

Figure 2:
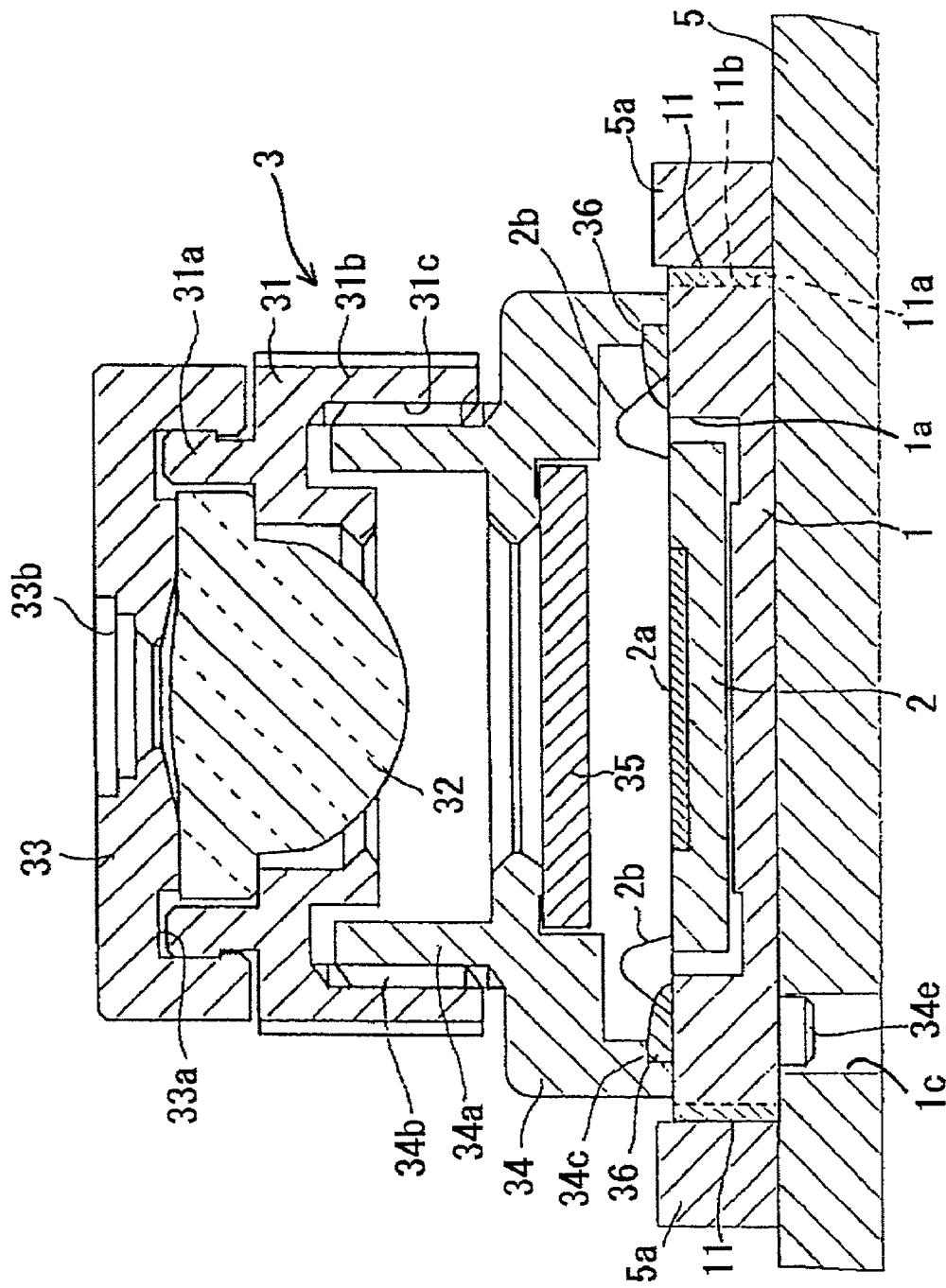
FIG. 2 is a central vertical sectional view of a solid photographing apparatus of the embodiment.

As shown by FIG. 2, an upper face (front face) of the circuit board 1 for a camera is formed with a recessed portion 1a for containing a photographing element 2. A light receiving portion 2a is disposed at a center of an upper face of the photographing element 2 contained in the recessed portion 1a and a terminal portion, not illustrated, of the photographing element 2 and the connection terminal portion 11 are bonded by wire bonding by using a wire 2b.

The circuit board 1 for a camera is fitted to a socket 5a of a main body circuit board 5 of a portable apparatus and by bringing the connection terminal portion 11 of the circuit board 1 and a connection terminal portion formed at an inner face of the socket 5a into contact, the circuit board 1 for a camera and the main body circuit board 5 are connected.

As shown by FIG. 1, there are provided hole portions 1b and 1c for fixing an optical apparatus unit 3 at corner portions on a diagonal line of the circuit board 1. The hole portion 1c is formed in a long hole slightly prolonged in a direction along the diagonal line to thereby enable to absorb more or less dimensional error.

As shown by FIG. 2, the optical apparatus unit 3 is for holding optical members of a lens 32 and the like, the lens 32 is held by a lens holder 31 and the lens 32 is clamped undetachably by fitting a recessed portion 33a of a lens clamp 33 to a connection piece 31a projected upwardly from an upper face of the lens holder 31 to lock by each other. A diaphragm portion 33b is provided at a central portion of an upper face of the lens clamp 33. A cylindrical portion 31b is provided to project downwardly at an outer peripheral portion of the lens holder 31 and a female screw portion 31c is formed at an inner peripheral face of the cylindrical portion 31b. An outer peripheral shape of the lens holder 31 is formed to be slightly larger than an outer peripheral shape of the lens clamp 33.

A holder 34 for holding the lens holder 31 is provided with a cylindrical portion 34a to project upwardly and a male screw portion 34b is formed at an outer peripheral face of the cylindrical portion 34a to screw together with the female screw portion 31c. By controlling an amount of screwing the female screw portion 31c the lens holder 31 and the male screw portion 34b of the holder 34, a distance between the lens 32 and light receiving portion 2a can be adjusted to thereby enable to carry out so-to-speak focusing. An infrared ray cut filter 35 is held opposing the lens 32 at an inner portion of the holder 34.

A solid photographing apparatus is constituted by adhering a lower end face of the cylindrical portion 34c projected downwardly from the holder 34 to an upper face of the circuit board 1 for a camera by using an adhering agent 36. As positioning means between the holder 34 and the circuit board 1 for a camera, as shown by FIG. 2 through FIG. 4, at diagonal line positions of the cylindrical portion 34c, positioning projections 34d and 34e are projected downwardly at positions capable of fitting to the hole portions 1b and 1c provided at the diagonal line positions of the circuit board 1 for a camera. After positioning the holder 34 by fitting the positioning projections 34d and 34e to the hole portions 1b and 1c, the adhering is carried out by the adhering agent 36.

Any of the lens holder 31, the lens clamp 33 and the holder 34 constituting the optical apparatus unit 3, is formed by a plastic having a dark color constituting so-to-speak deep color having light blocking performance and therefore, only light incident from the diaphragm portion 33b reaches the photographing element 2. When materials used for the circuit board 1 for a camera and the circuit board 5 for a portable apparatus, use inorganic species materials as in, for example, a metal species board, a ceramic species board and the like, these are provided with low light transmitting performance and therefore, light transmission to a problematic degree is not caused from a lower direction or a side direction, as described above, only light from an upper direction incident from the diaphragm portion 33b, reaches the photographing element 2 and an excellent quality of image is provided. However, since the inorganic materials are expensive, there is a case of using a board of an inexpensive organic species material in view of cost and in such a case, since the board of the organic material is provided with light transmitting performance and therefore, there may be brought about a drawback that light form the lower direction and side direction detours to reach the photographing element 2.

According to the embodiment, the circuit board 1 for a camera comprises a board of an organic material and normally, there is used a board referred to as glass/epoxy board. The board is made of a material mixed with epoxy resin and glass fiber or glass filler and is advantageous in view of low price, however, as the thickness is thinned, light transmitting performance is exhibited and therefore, a measure for blocking light is needed.

Figure 5:
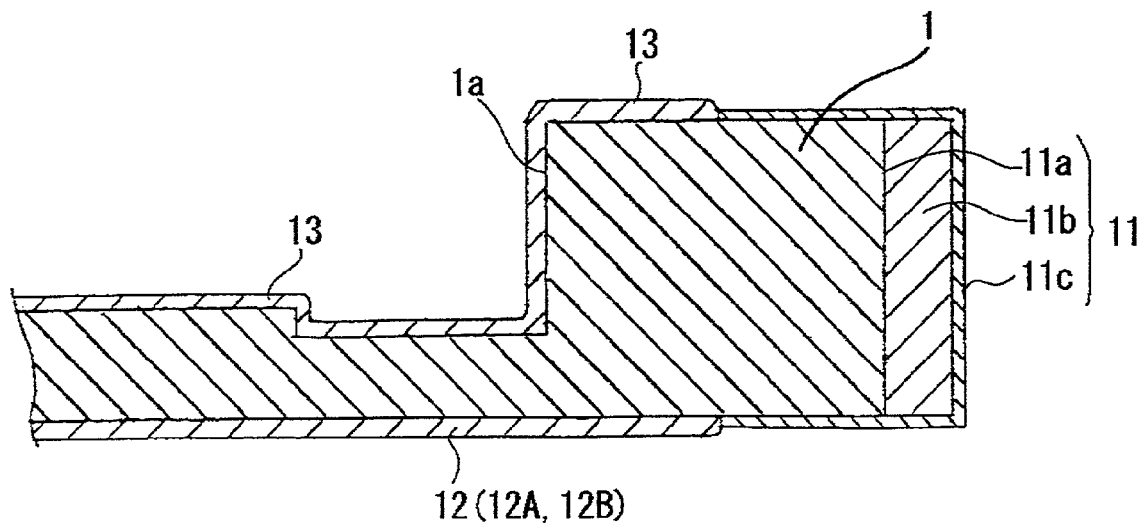
FIG. 5 is a partially enlarged sectional view of a circuit board for a camera.

Hence, as shown by FIG. 3 though FIG. 5, a light blocking member 12 is formed at a rear face of the circuit board 1 for a camera. The light blocking member 12 of FIG. 3 is a conductive pattern 12A, is provided to slightly separate from the connection terminal portions 11 at a peripheral portion of the circuit board 1 for a camera and is conducted to and integrally formed with a ground terminal 11A constituting one of the connection terminal portions. The circuit board 1 for a camera is constituted substantially by a square shape and when about the same numbers of the connection terminal portions 11 are formed at peripheral portions, top and tail of the board is difficult to determine and therefore, when the ground terminal 11A constituting one of the connection terminal portion 11 aligned at a lower side of FIG. 3, is integrally formed with the conductive pattern 12A, the determination of top and tail can easily be known. It is preferable to form the conductive pattern 12A by using a metal the same as that of the connection terminal portion 11 of, for example, copper paste or the like since the formation is facilitated in view of fabrication.

The light blocking member 12 shown in FIG. 4 is formed by a resist 12B having light blocking performance. As the resist 12B having the light blocking performance, a resist of, for example, black color is used. The resist 12B of black color is provided over an entire face of portions excluding the connection terminal portions 11 at the peripheral portion of the circuit board 1 for a camera. Further, the connection terminal portion 11A is the ground terminal similar to that in the example of FIG. 3 and is formed to be slightly larger than other terminal to facilitate to determine.

When the light blocking member 12 is constituted in this way, the light blocking performance is promoted and it can be prevented that unintended light invades from the rear face side to detour to reach the photographing element 2. When the conductive pattern 12A is constituted, top and tail of the board can easily be determined by forming the conductive pattern 12A integrally with one of the connection terminal portions. Further, when the resist 12B of black color is constituted, not only the light blocking performance is promoted but also insulating performance can be promoted.

Figure 6:
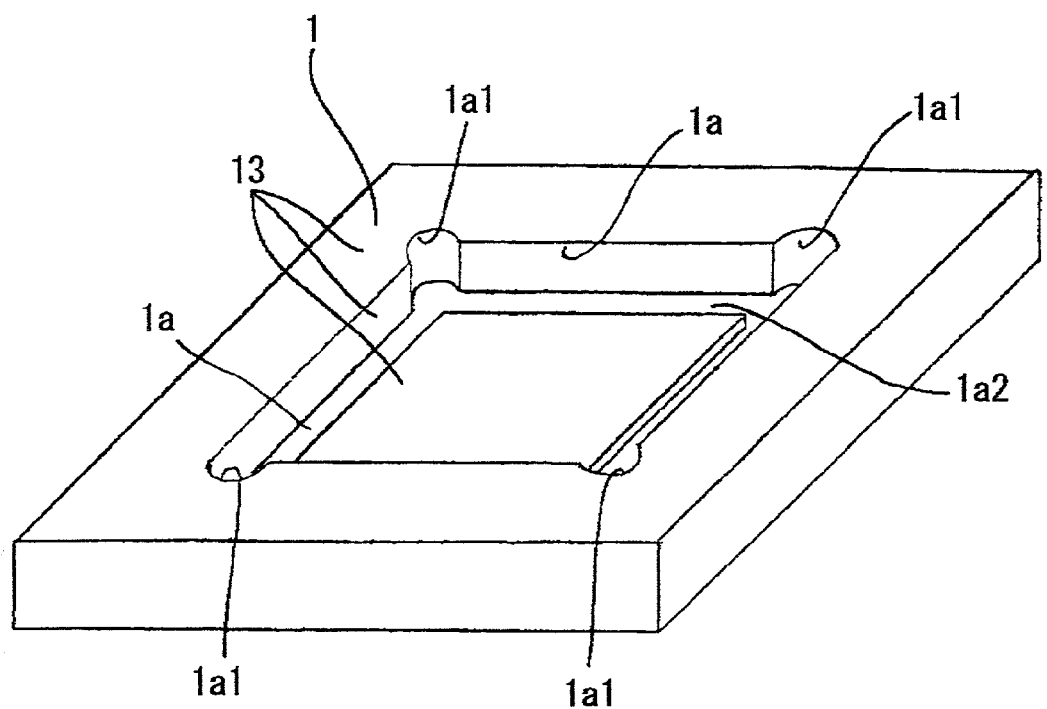
FIG. 6 is a perspective view of a front face side of a circuit board for a camera omitting illustration of a connection terminal portion.

As explained in reference to FIG. 2, the recessed portion 1a is provided on the front face side of the circuit board 1 for a camera and the photographing element 2 is contained in the recessed portion 1a, and as shown by FIG. 5 and FIG. 6, a resist 13 is formed also on the front face side including an inner face of the recessed portion 1a at portions thereof excluding the connection terminal portions 11 at the peripheral portion. A resist of green color or blue color may be used for the resist 13 as is normally used, thereby, in addition to inherent operation of insulation, also shavings of the board in forming the recessed portion 1a are covered by the resist 13 and therefore, adverse influence can be hampered from effecting on photographing by preventing the shavings from adhering to the photographing element 2 contained in the recessed portion 1a.

However, when the resist 13 is constituted by a resist having light blocking performance the same as that of the above-described resist 12, higher light blocking performance is realized with regard to the photographing element 2, unintended light can firmly be prevented from invading the photographing element 2 and at the same time, similar to the above-described, also the shavings of the board in forming the recessed portion 1a can be prevented from adhering to the photographing element 2. Further, as the resist 13 having the light blocking performance, it is preferable to constitute a resist of black color similar to the above-described and not only the light blocking performance is promoted but also the insulating performance can be promoted.

Further, when the resist 13 is constituted by a resist having the light blocking performance, a resist of green color or blue color may be used for the resist 12 of the rear face as is normally used.

As shown by FIG. 2, the circuit board 5 for a portable apparatus fixed to an inner portion of a case for the portable apparatus, is provided with the socket portion 5a to which the circuit board 1 for a camera can be fitted. The inner face of the socket portion 5a is provided with a terminal portion, not illustrated, oppositely brought into contact with and conducted to the connection terminal portion 11. In a state in which the circuit board 1 is fitted to the socket portion 5a and the connection terminal portion 11 and the terminal portion are conducted to each other, the direction of conduction is a direction of faces of the boards 1 and 5.

Further, the invention is not limited to the constitution in which the main body circuit board is provided with the socket portion to which the circuit board for a camera is fitted and connected but there may be constructed a constitution in which an end face of the connection terminal portion 11 is connected to a predetermined terminal of the main body circuit board by using solder or the like.

A brief explanation will be given of an example of a procedure of fabricating the circuit board 1 for a camera. First, a plate for a board for forming the circuit board is prepared, the wiring patterns are formed at the front face and the rear face of a position to be formed with the connection terminal portion 11, the through hole 11a is formed at central portions of the wiring patterns and, for example, the copper paste 11b constituting the conductive member is embedded in the through hole 11a. Further, the recessed portion 1a for containing the photographing element 2 is formed at the front face of the plate for the board. As the recessed portion 1a, as shown in FIG. 6 by the perspective view, there is formed a recessed portion having a planar shape slightly larger than a planer shape of the photographing element 2 and four corner portions 1a1 are formed by perforating the four corner portions 1a1 in an arc-like shape to escape from corners of the photographing element. Further, a depth of the four corner portions 1a1 is a depth substantially equal to a thickness of the photographing element 2, however, a peripheral portion 1a2 thereof is perforated to be deeper than the depth of the four corner portions 1a1. After perforating the recessed portion 1a, as shown by FIG. 5, the resist 13 of black color constituting the resist having the light blocking performance is provided at portions excluding the connection terminal portions 11. Further, the above-described resist 12 is provided at portions excluding the connection terminal portions of the peripheral portion also on the rear face side of the circuit board 1 for a camera. Thereafter, the plate for the board is cut by lines passing through centers of the through holes 11a. The gold-plated layer 11c is formed at the wiring patterns of the front face and the rear face and the faces of the copper paste 11b to constitute the connection terminal portions 11. Thereby, one sheet of the circuit board 1 for a camera can be formed.

Although according to the embodiment, resists are provided at both faces of the front face including the recessed portion 1a and the rear face of the circuit board 1 for a camera, a resist having light blocking performance may be provided only at either one face of the circuit board 1 for a camera. Further, although according to the example, the solid photographing apparatus is the provided to a portable apparatus, the invention is not limited thereto but the solid photographing apparatus may be provided at a monitoring apparatus or the like.

In this way, according to the invention, the photographing element is provided at one face of the circuit board for a camera, the light blocking member is provided at other face thereof and therefore, the light blocking performance can firmly be achieved by a simple constitution with no need of separately providing a special member. When the light blocking member is formed by the conductive pattern, the light blocking member can be formed integrally with one of the connection terminal portions and therefore, the position of the board can easily be determined and when the light blocking member is formed by the resist having the light blocking performance, also the insulating performance can be ensured. Further, since the inner face of the recessed portion for containing the photographing element, is formed with the resist having the light blocking performance and therefore, not only the insulating performance can firmly be achieved but also light from outside other than light for photographing can be prevented from invading. When the light blocking member is formed by the resist of black color, the light blocking performance can further be promoted.

What is claimed is:

1. A solid photographing apparatus, comprising:
   a photographing element having an upper face with a light receiving portion and an opposing lower face;
   a circuit board having a circuit board upper face and a circuit board lower face;
   said photographing element having said lower face mounted to said circuit board upper face and being electrically connected to said circuit board;
   a light blocking member disposed on said circuit board lower face shielding light from reaching said photographing element through said circuit board lower face;
   said light blocking member being a conductive pattern; and
   said circuit board being provided with connection terminals at a peripheral portion thereof and the conductive pattern is integrally formed with one of the connection terminal portions.

2. The solid photographing apparatus according to claim 1 wherein the conductive pattern is formed by a copper paste.

3. The solid photographing apparatus according to claim 1 wherein the light blocking member is a resist having a light blocking performance.

4. The solid photographing apparatus according to claim 3 wherein the circuit board is provided with connection terminals at a peripheral portion thereof and the resist is provided at a portion of the circuit board excluding the connection terminal portions.

5. The solid photographing apparatus according to claim 4 wherein the resist is a resist of black color.

6. The solid photographing apparatus according to claim 3 wherein the resist is a resist of black color.

7. The solid photographing apparatus according to claim 1 wherein the circuit board is formed of a non-opaque material.

8. The solid photographing apparatus according to claim 1 wherein the circuit board is formed of a glass-epoxy material.

9. The solid photographing apparatus according to claim 1 further comprising:
   an optical member including a lens which is provided in front of the light receiving portion of the photographing element and which introduces incident light to the light receiving portion; and
   a lens bolder holding the lens.

* * * * *